(12) United States Patent
Sutardja (10) Patent No.: US 6,411,233 B1
(45) Date of Patent: Jun. 25, 2002

(54) METHOD AND APPARATUS FOR DIRECT RAM ANALOG-TO-DIGITAL CONVERTER CALIBRATION

(75) Inventor: Sehat Sutardja, Cupertino, CA (US)

(73) Assignee: Marvell International Ltd, Hamilton (BM)

( * ) Notice: Subject to any disclaimer, the term of this patent is extended or adjusted under 35 U.S.C. 154(b) by 2 days.

(21) Appl. No.: 09/587,991

(22) Filed: Jun. 6, 2000

(51) Int. Cl.$^7$ ................................................ H03M 1/10
(52) U.S. Cl. ........................................ 341/120; 341/155
(58) Field of Search ................................ 341/120, 155, 341/156, 144, 118, 159

(56) References Cited

U.S. PATENT DOCUMENTS

| | | | |
|---|---|---|---|
| 4,816,831 A | 3/1989 | Mizoguchi et al. | 341/156 |
| 4,999,630 A | 3/1991 | Masson | 341/120 |
| 5,218,362 A | 6/1993 | Mayes et al. | 341/121 |
| 5,294,926 A | 3/1994 | Corcoran | 341/120 |
| 5,349,354 A | 9/1994 | Ito et al. | 341/156 |
| 5,416,485 A | 5/1995 | Lee | 341/172 |
| 5,500,644 A | 3/1996 | Denjean et al. | 341/120 |
| 5,594,612 A | 1/1997 | Henrion | 341/120 |
| 5,852,415 A | * 12/1998 | Cotter | 341/120 |
| 5,861,829 A | 1/1999 | Sutardja | 341/122 |
| 6,069,577 A | * 5/2000 | Morisson | 341/120 |

* cited by examiner

*Primary Examiner*—Brian Young
(74) *Attorney, Agent, or Firm*—Eric B. Janofsky (57) ABSTRACT

In the present invention an ADC is calibrated using a matrix of selector elements to connect a plurality of reference voltages to a plurality of comparator circuits. Each selector element contains a switch connected to a memory cell. The switch is controlled to be on or off by the data in memory cell. When the switch is controlled to be on, a reference voltage at the input to the selector element is connected to the reference input of a comparator trough the output of the selector element. A plurality of selector elements are connected to the reference input of each comparator in the ADC, and the selector element memory cells are programmed such as to allow one voltage from a range of reference voltages to be connected to each comparator. Each voltage in the range is a small voltage increment from the adjacent voltages connected to other selector elements. During calibration a reference voltage for each comparator is selected to allow the digital output of the ADC to be within a least significant bit of the value of the input voltage.

31 Claims, 5 Drawing Sheets

METHOD AND APPARATUS FOR DIRECT RAM ANALOG-TO-DIGITAL CONVERTER CALIBRATION

BACKGROUND OF THE INVENTION

1. Field of Invention

The present invention relates to analog to digital converters and more specifically to the calibration of analog to digital conveners.

2. Description of Related Art

Advances in integrated circuit technology produce smaller and smaller devices. Circuits shrink, chips become smaller or contain more function. Maintaining the same accuracy and resolution in circuits such as analog to digital converters (ADC) become a greater challenge. As the devices grow smaller the offset voltage of the comparator circuits used convert the analog signal into the first stage of conversion to a digital signal grow larger.

U.S. Pat. No. 5,594,612 (Henrion) shows an ADC that has digital linearity correction. A calibration signal is generated using a digital to analog converter (DAC) and converted by an ADC to a digital signal that has been compensated in accordance with compensation coefficients. The compensation coefficients are adjusted in response to distortion components. In U.S. Pat. No. 5,218,362 (Mayes et al.) a multi-step digital to analog converter is described with an embedded correction memory for trimming resistor ladders to correct for non-uniformities in the resistance of the ladder network.

Figure 1A:
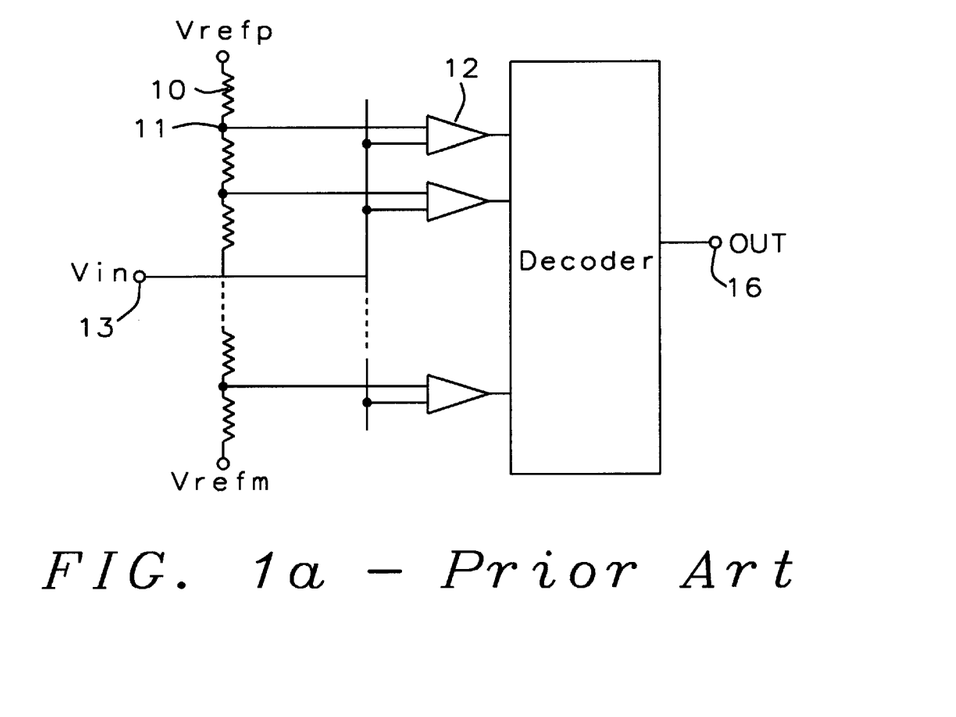
FIGS. 1a and 1b are diagrams of an ADC of prior art.
Figure 1B:
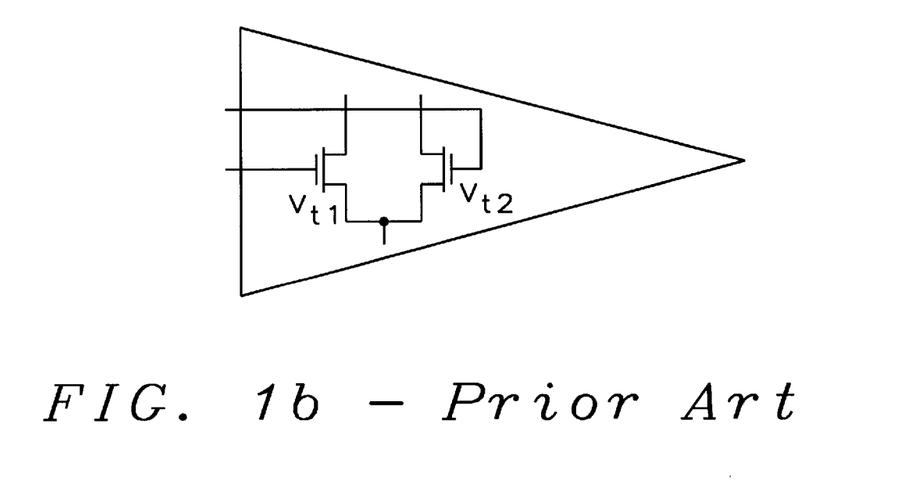

In FIG. 1a is shown an ADC of prior art where a resistor string 10 with multiple tap points 11 is used to supply a plurality of reference voltages to a plurality of comparators 12. An analog input voltage Vin 13 is connected to one input of the comparators 12 while the reference voltage from the multi-tap resistor string is connected to the other input to the comparators 12. The outputs of the comparators are connected to a decoder which creates a digital output 16. In FIG. 1b is shown the input stage of the comparators. An offset voltage occurs in the differential input stage when the threshold voltage Vt1 does not equal Vt2. To compensate for this offset voltage, which could vary significantly from chip to chip, the reference voltage applied to the comparator needs to be changed from its ideal value.

Figure 2A:
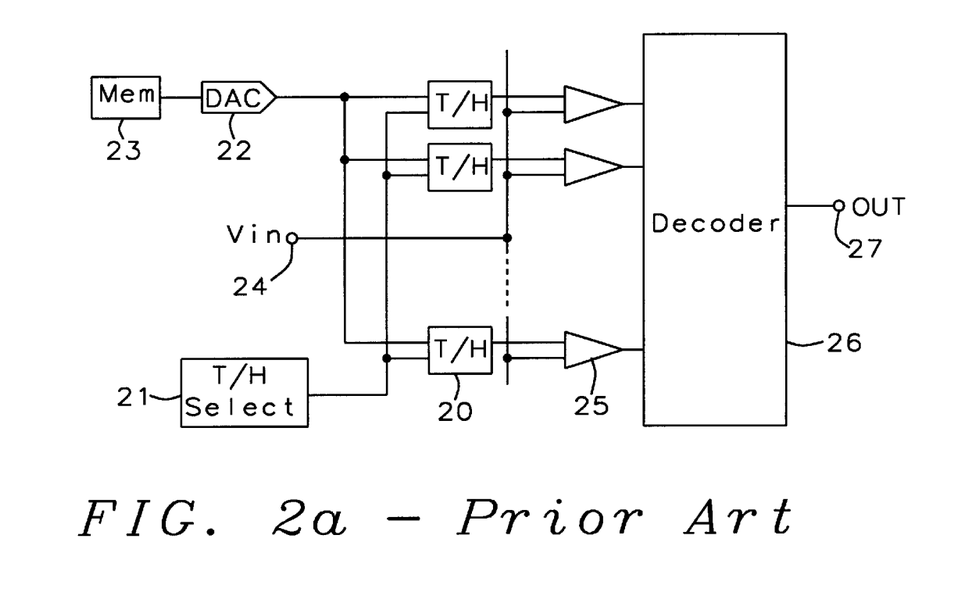
FIGS. 2a and 2b are diagrams of an ADC of prior art.
Figure 2B:
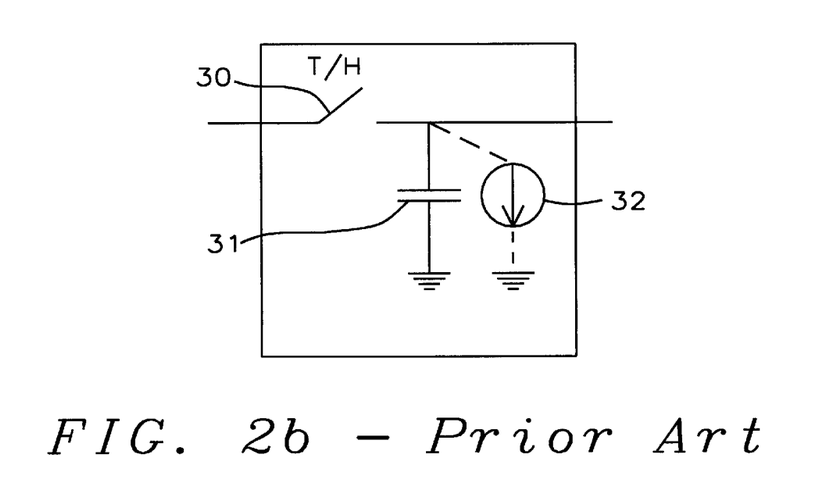

In FIG. 2a is another ADC of prior art. Here a track and hold circuit (T/H) 20 is selected by a T/H selector 21 and a DAC 22 under the control of data from a memory 23 program a voltage into the track and hold circuit 20 which compensates non-linearities caused by offset voltages of transistors. A calibration voltage applied as Vin is compared to the voltage on the track and hold circuits 20 in the comparators 25. The track and hold circuit 20 on each of the comparators 25 are adjusted by the DAC until the digital output 27 of the decoder 26 produces an accurate representation of the input analog voltage 24 to within a least significant bit, or fraction of a least significant bit by using a more accurate DAC. In FIG. 2b is shown an equivalent representation of the track and hold circuit 25. When the selector 21 selects a track and hold circuit 20 switch 30 is closed allowing the DAC 22 to charge capacitor 31 to a reference voltage. After the switch is opened, charge on capacitor 31 begins to be lost through leakage mechanisms as represented by the current source 32. As device geometries get smaller this leakage current 32 increases, requiring increased frequency of refresh to restore the voltage on the capacitor 31.

An ADC design is needed that can compensate for the characteristics of shrinking geometry's, while benefiting from the higher productivity of the ever-evolving semiconductor technology. This ADC design would allow a calibration that lasts between calibration steps and compensates for the non-unformities caused by resistor networks and transistor threshold variations.

OBJECTS OF THE INVENTION

It is an objective of the present invention to provide a reference voltage to a comparator circuit of an ADC which compensates for non-uniformity's that are cause by variations in the process that is used to manufacture the ADC.

It is also an objective of the present invention to provide a plurality of the reference voltages to a plurality of comparator circuits under control of memory cells in a matrix of selector elements.

It is further an objective of the present invention to provide various ways to layout the wiring from the taps of a resistor string to a set of selector elements connecting the reference voltages to the comparator circuits,

SUMMARY OF THE INVENTION

In the present invention an ADC is configured with a plurality of comparators comparing an input voltage to a plurality of reference voltages, one reference voltage connected to each comparator. The output of each comparator is connected to a decoder which produces a digital representation of the input voltage. The uniqueness of the present invention is in the method that the reference voltages are selected and connected to the comparators.

An M×N matrix of selector elements connect a plurality of reference voltages to a plurality of voltage comparators. The matrix is arranged with M rows of N selector elements. Within each selector element a memory cell controls a switch that is connected between the input and output terminals of the selector element. The output terminals of a row of selector elements are connected together and to the reference input of a comparator. Each row on the M×N matrix of selector elements is connected to a separate comparator. A different reference voltage is connected to each selector element in a row, and when a memory cell selects a switch to be on, or selected, the reference voltage connected to the selector element is connected to the reference input of the comparator. The switches in the selector elements are selected to be on or off depending upon data stored in a memory cell that is connected to each switch. The memory cell can be constructed from a variety of cell technologies such as SRAM, DRAM, FLASH and not excluding other technologies. A range of reference voltages is connected to the selector elements in each row. The reference voltages can be created by any means that will provide a wide range of voltages that are incrementally a small voltage difference apart. A resistor string connected between two bias voltages with a plurality of voltage taps is but one way to provide the necessary reference voltages. The range of voltages provided in small increments allow the reference voltage to the comparator to be selected such that non-linearities caused by process variations in such parameters as transistor threshold voltage to be compensated in order to provide a more accurate compare to the ADC input voltage. This is accomplished by selecting a reference voltage for a particular comparator that is above or below an "ideal" voltage to compensate for such process variations as differences in threshold voltage.

In the present invention an M×N matrix of selector elements arranged in M rows and N columns is used to connect reference voltages to a plurality of comparators.

Each switch within the selector elements is controlled on or off depending upon data stored in a memory cell contained within each selector element. There is a row of selector elements for each comparator, and a first terminal of each selector element in a row is connected together and then connected to the reference input to a comparator circuit, A second terminal of each selector elements is connected to a tap in a resistor string which is connected between two bias voltages. The connecting wire to a resistor tap is routed across the matrix of selector elements in such a way as to connect one selector element in each row that is crossed by the resistor tap wire. The taps on the resistor string are in increments that allow the ADC to resolve an input voltage to a portion of the least significant bit (LSB). Depending upon what the specified resolution of the ADC is, the taps on the resistor string could for example be every LSB, every half LSB every fourth of an LSB or any other convenient fraction of an LSB. The number of selector elements in a row connected to the resistor string is dependent upon the increments of the taps on the resistor string and the amount of variation in circuit parameters that is compensated by the ability to select au incremental range of reference voltages. A particular reference voltage is connected to selector elements in more than one row to allow the range of voltages necessary compensate for variations in key parameters, such as threshold voltage.

A plurality of first level wiring is connected to a fit terminal of N of M×N selector elements. The first level wiring connects the first terminals of the selector elements to a first terminal of a plurality of comparators. The second terminal of the plurality of comparators is connected to the analog to digital converter (ADC) input voltage. A plurality of second level wiring connects a plurality of reference voltages to the second terminal of a plurality of selector elements and to the second terminal of only one selector element in each tow. The number of selector elements connected by the second level wiring is at most M. Assuming the first level wiring is primarily in the X direction, the second level wiring uses both the X and the Y direction to route the plurality of wires connecting the second terminals of a plurality of selector elements, one in each row, together and further connected to a reference voltage. Depending on the resolution of the ADC, the plurality of the second level wiring will connect to selector elements in every Z adjacent columns, where Z=1, 2, and 4 to produce a resolution of one LSB (least significant bit), one half LSB and one fourth LSB respectively.

BRIEF DESCRIPTION OF THE DRAWINGS

This invention will be described with reference to the accompanying drawings, wherein.

DETAILED DESCRIPTION OF THE PREFERRED EMBODIMENT

Figure 3A:
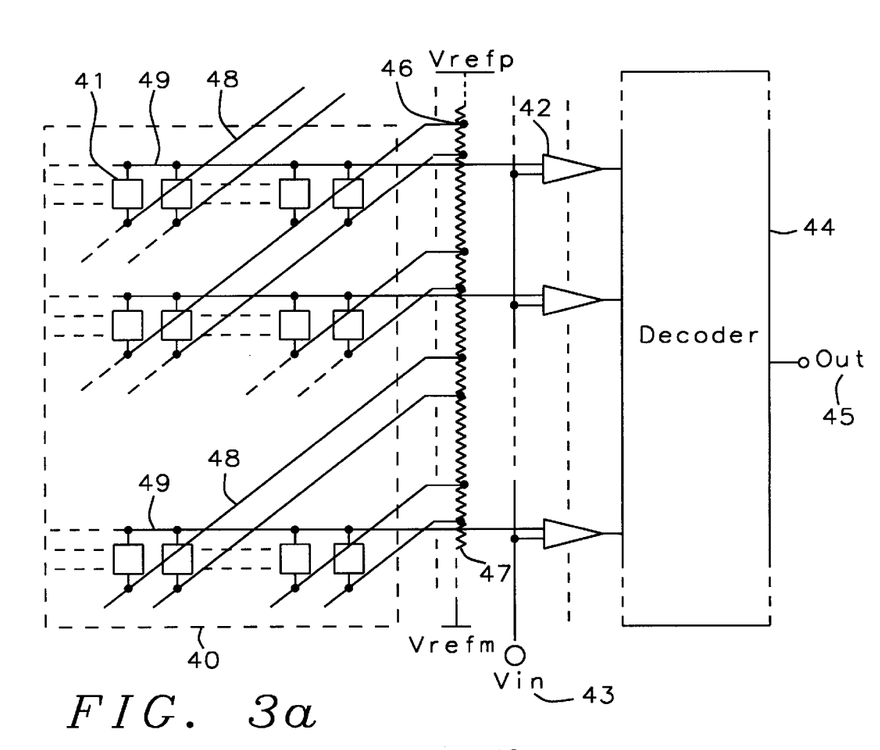
FIGS. 3a is a diagram of the preferred embodiment of the present invention.

In FIG. 3a is shown an ADC of the preferred embodiment of the present invention, which may be fabricated as a single integrated circuit. A matrix of selector elements 40 are formed into rows and columns. Each row 49 of selector elements 41 is connected to one input of a comparator circuit 42 known herein as the reference input. The other input of each comparator circuit known herein as the voltage input is connected to the voltage input Vin 43 of the ADC. The comparator circuits 42 are connected to a decoder 44 which produces the digital output 45 of the ADC. Voltage taps 46 along a resistor string 47 are connected to selector elements 41 by wiring 48 that crosses the selector element matrix 40. The resistor string is connected between a first bias voltage Vrefp and a second bias voltage Vrefm. Each selector element 41 in a row is connected to a different tap 46 along the resistor string 47. The voltages connected to the selector elements 41 in a row of the matrix 40 vary in small voltage increments over a range that is centered at an "ideal" reference voltage for the comparator 42 connected to the row of selector elements. The voltage increments are fractions of a least significant bit (LSB) of the ADC and allow voltage disparities caused by process variations to be compensated such that the comparator 42 will compare the input voltage to a reference voltage to within a fraction of the LSB.

Continuing to refer to FIG. 3a, the offset voltage for each comparator 42 is obtained by a self-calibration process performed before the ADC begins operating. For example, upon initial factory test or upon each power up of the circuit, a zero input voltage at input 43 should yield a zero digital output indication at the output 45 of decoder 44. Specifically, each comparator 42 is activated in sequence with a known input voltage on one input and with selectable increments around a desired threshold reference value available to apply to the other input of each comparator in succession. Other comparators 42 than the one being calibrated can be disabled to avoid adverse effects on decoder 44. Any deviation between known inputs applied to a comparator that produces an output therefrom may he compensated by selecting alternative selector elements 41 to provide an offset correcting reference voltage to the comparator. In this way, each comparator 42 provides an output to the decoder 44 for a known input voltage when compared with its corrected reference input voltage during normal operation.

Continuing to refer to FIG. 3a, the selection of the selector elements 41 that are required to so calibrate each comparator against its individual offset errors may be stored in lookup table, not shown, for recall during normal operation on unknown voltages applied to input 43. Digital values describing the selection of selector elements 41 to provide the proper offset voltages for the comparators 41 are stored in entries of a memory, which may be integrally formed with the switch element, and which may be a segment of random access memory ("RAM") or other storage device. During normal operation of the ADC, the lookup table provides the digital values needed to select a selector element and in turn a reference voltage that compensates for the iherent offset voltage of each comparator 42. The selected reference voltage for each comparator 42 will be somewhat different from the ideal reference voltage at each threshold level per comparator 42. Of course, the greater the comparator 42 input offset voltage, the greater the difference between the ideal reference voltage and the corrected reference voltage as determined by the selection of the selector elements 41.

Continuing to refer to FIG. 3a, a matrix M×N selector elements 40 is formed such that each row of N selector elements is aligned with a comparator 42 in a column of M comparators. A first terminal 49 of all the selector elements in a row of the M×N matrix of selector elements are connected together and farther connected to a first input terminal of a comparator circuit 42 using first level wiring. A resistor voltage divider 47 providing reference voltages to the matrix of selector elements is arranged with respect to the matrix of selector elements such that connections between the taps 46 and the selector elements 41 are made using second level wiring 48. The second level wing 48 from taps 46 of the voltage divider 47 to a second terminal of the selector elements 41 is done such as to connect to only one selector element in each M rows of the M×N matrix. The second level wiring 48 is routed so as to connect to selector elements in adjacent rows of the M×N matrix of selector elements 40, and routing of the second level wire uses both an X and a Y routing direction. The resolution of the ADC the second level wiring 48 will connect to selector elements in adjacent columns located on adjacent rows for a resolution of one LSB (east significant bit), or every second column between adjacent rows for a resolution of one half LSB, or every fourth column between adjacent rows for a resolution of one quarter LSB.

Figure 3B:
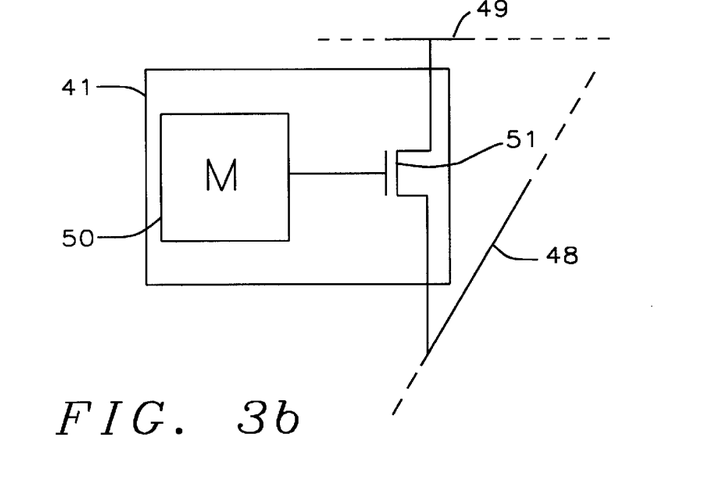
FIG. 3b is a diagram showing the selector element with the enclosed memory cell and switch in the preferred embodiment.

In FIG. 3b is shown a preferred embodiment of the present invention, a selector element 41 connected between a wire carrying a reference voltage 48 and a wire connected to comparator reference input 49. The gate of the transistor switch 51 is connected to a memory cell M 50. The data stored in the memory cell 50 determines whether the switch 51 is "on" connecting the voltage on wire 48 to the reference input of a comparator 42 connected to wire 49, or "off" isolating the comparator 42 reference input from the voltage on wire 48. In the preferred embodiment the memory cell 50 is an SRAM cell integrated in close proximity to the switch 51; however, the memory cell 50 could be implemented from other memory technologies such as DRAM and Flash memory cells. A calibration control circuit, not shown, is used to control the memory cell within each selector element. Variations from the preferred embodiment may result in variations of the design or implementation of the ADC that are well know in the state of the art.

Figure 4A:
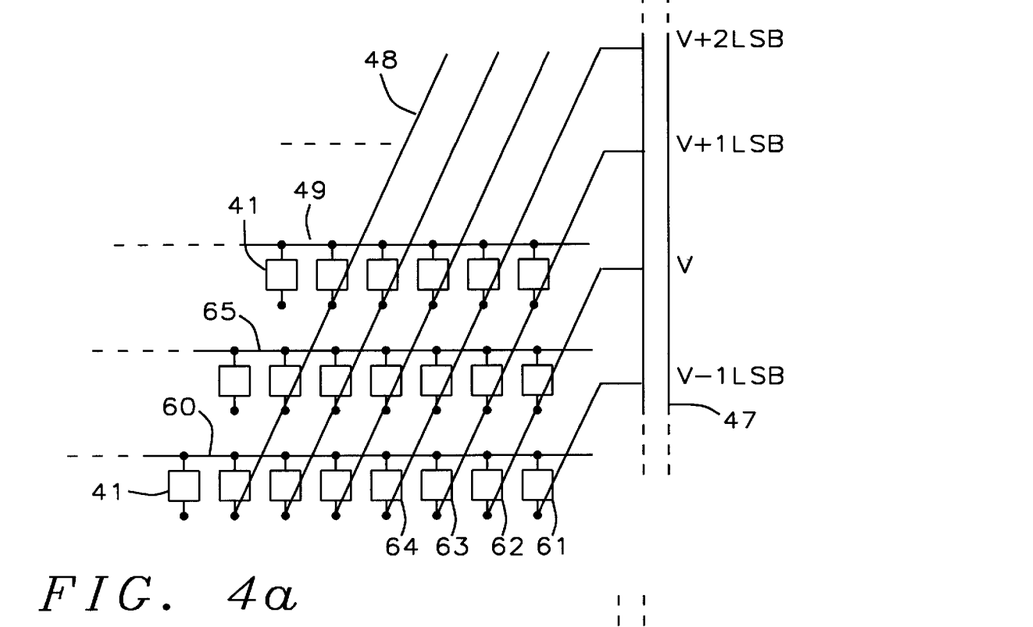
FIGS. 4a, 4b and 4c are diagrams of different arrangements of voltage connections to rows of selector elements in the preferred embodiment.

In FIG. 4a is shown a portion of the selector element matrix 40. The selector elements 41 are connected to wires 49 which connect to the reference input of the comparators (not shown) and to wires 48 that connect to voltage taps 46 along the resistor string 47. Looking at the row of selector elements 41 connected to the reference input wire 60, the first selector element 61 in the row is connected to a tap having a value of one least significant bit less than the voltage V, or V−1LSB. The second selector element is connected to a tap producing a voltage of V, and the third selector element is connected to a tap producing V+1LSB. The fourth selector element 64 in the row is connected to V+2LSB and so on until the range of voltages necessary to compensate for process variations is established along tee selector elements connected to reference input wire 60. It should be noted that adjacent rows are serviced by some of the same voltage taps 46 that are used for row connected to wire 60. For instance, the voltage V is connected to the first selector elements 66 in the row connected to wire 65, and V+1LSB is connected to the second selector elements 67. The ideal reference voltage for each row varies by 1LSB, for instance the ideal reference voltage for wire 60 might be V+1LSB where the ideal reference voltage for wire 65 might be V+2LSB, The wires 48 from the resistor string 47 are shown to be schematically routed diagonally, For layout, this diagonal routing is preferred, but other routing may be more appropriate given a different set of circumstances then the design presented herein.

Figure 4B:
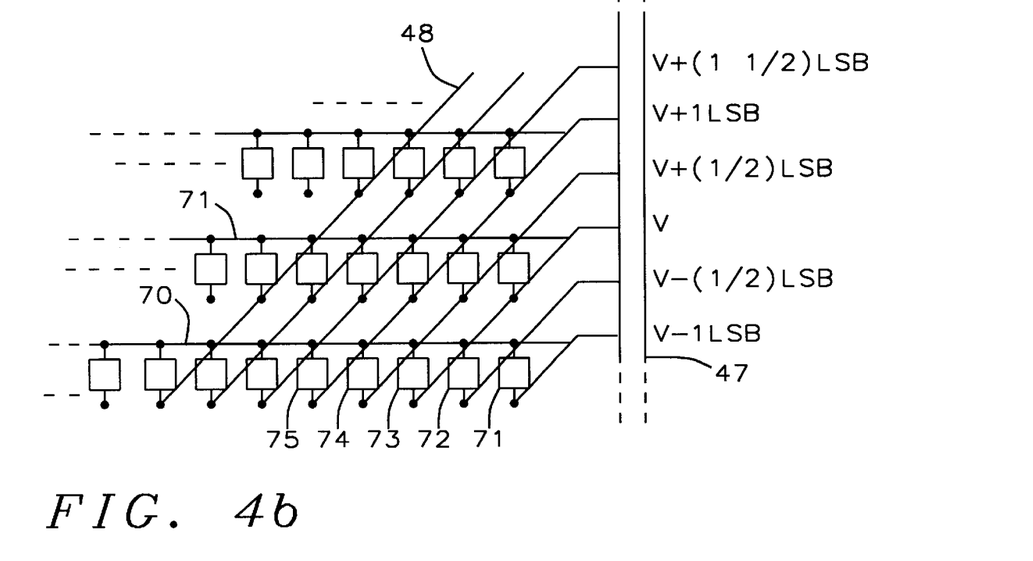

In FIG. 4b is shown a portion of the selector element matrix 40 similar to that shown in FIG. 4a, except the increment of voltage taps 46 along the resistor string 47 are one half LSB smaller. There is a potential for a greater number of voltage tap wires 48 being connected to a row of selector elements in order to provide the range of adjustment and at the same time the resolution of the reference voltage. If the same range in of voltages, +1LSB to −1LSB, is required for the selector elements connected to wire 70 as for those selector elements connected to wire 60, then selector element 71 would be connected to V−1LSB, selector element 72 connected to V−(1/2)LSB, selector element 73 connected to V, selector element 74 connected to V+(1/2) LSB and selector element 75 connected to V+1LSB. Each row is still separated by a voltage of 1LSB. If the ideal voltage is V fox wire 70, then the ideal voltage for wire 71 would be V+1LSB. The difference between FIG. 4b and FIG. 4a is the voltage increments which result in more selector elements being required to be connected to the reference voltage input wires 70 and 71.

Figure 4C:
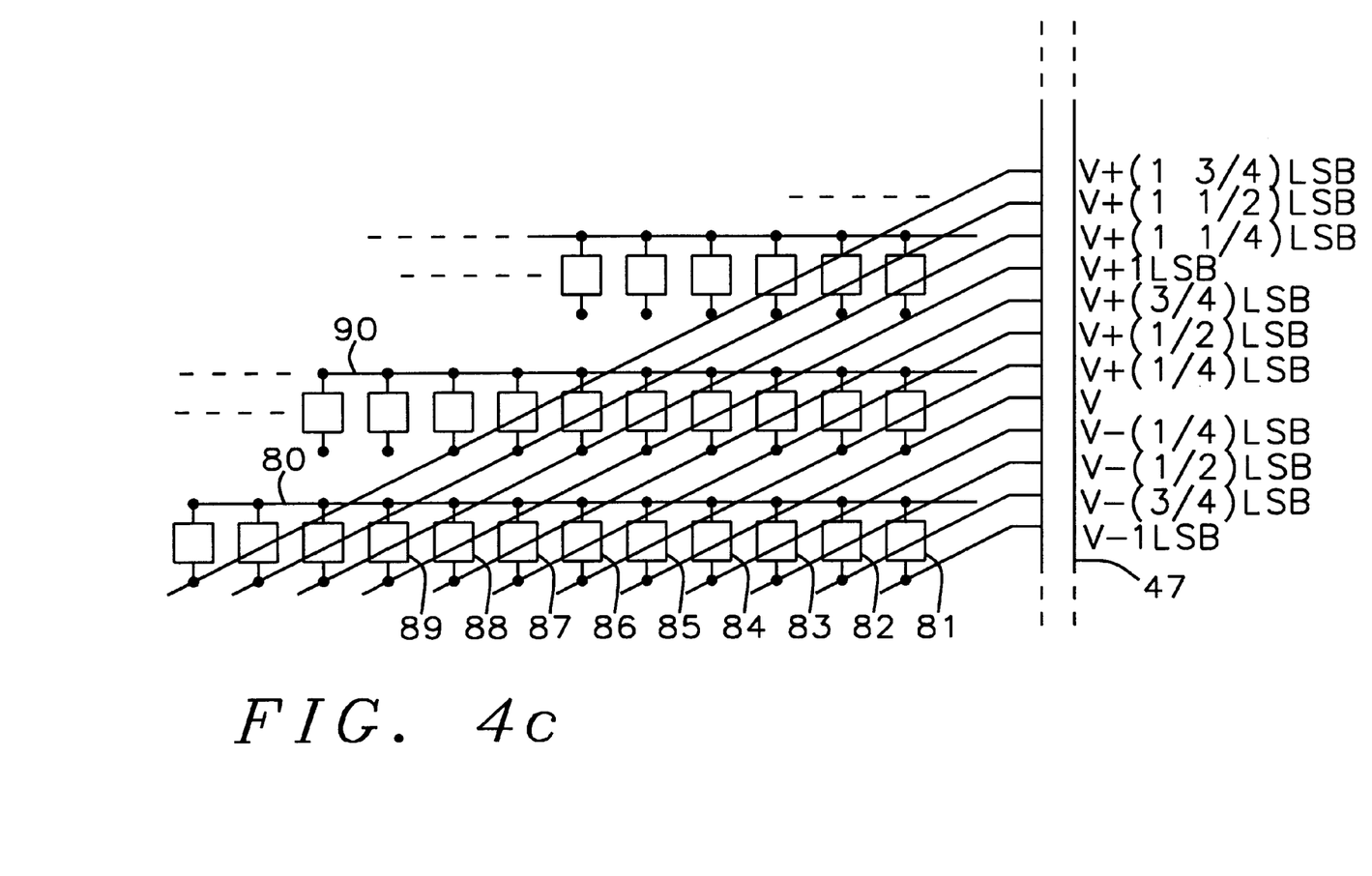

In FIG. 4c is shown a lay out for a portion of selector element matrix 40 where the increments of voltage taps 46 along the resistor string 47 is one quarter LSB. The ideal voltage for reference wire 80 is V which is the same for FIGS. 4a and 4b. To allow a range of plus or minus 1LSB selector element 81 would be connected to V−1LSB, selector element 82 connected to V−(3/4) LSB, selector element 83 connected to V−(1/2) LSB, selector element 84 connected to V−(1/4) LISB, selector element 85 connected to V, selector element 86 connected to V+(1/4) LSB, selector element 87 connected to V+(1/2) LSB, selector element 88 connected to V+(3/4) LSB, and selector element 89 connected to V+1LSB, If the ideal voltage is V for wire 80, then the ideal voltage for wire 90 would be V+1LSB. The difference between FIG. 4c and FIGS. 4a and 4b is the voltage increments which result in more selector elements being required to be connected to the reference voltage input wires 80 and 90.

In the preceding discussion pertaining to FIGS. 3a, 3b, 4a, 4b and 4c, it was not intended to imply that the resistor string 47 was the only way to develop the voltage increments needed to be connected to the selector element matrix. The voltage increments used in the prior discussion, while exemplary of what can be done, are not necessarily the only increments both in range and value that produce a useful ADC. The selector element matrix could be other than rows and columns, and the wiring connecting the selector elements to a reference voltage, whether created from a resistor string or by some other means, are not required to be routed through the selector element matrix in an orderly diagonal fashion. The selector matrix 40 provides a useful switch matrix that can be used in other applications similarly as described herein or with both switch terminals of a selector element connected independent of the terminals of other selector elements.

While the invention has been particularly shown and described with reference to preferred embodiments thereof, it will be understood by those skilled in the art that various changes in form and details may be made without departing from the spirit and scope of the invention.

What is claimed is:

1. An ADC calibration circuit comprising:
   a) a plurality of comparators;
   b) M×N selector elements arranged in M rows and N columns, each of said M×N selector elements having first and second terminals;

c) a plurality of first wirings, each of said plurality of first wirings being in communication with said first terminals of N of said M×N selector elements for each corresponding one of the M rows, wherein each of said plurality of first wirings is in communication with a corresponding a second input of each of said plurality of comparators;

d) a plurality of second wirings, each of said plurality of second wirings being in communication said second terminals of X of said M×N selector elements and to only one of said M×N selector elements on each one of the M rows, wherein X is at most M, wherein each of said plurality of second wirings is in communication with a corresponding one of a plurality of reference voltages.

2. The ADC calibration circuit of claim 1, wherein each of M×N said selector elements comprises a memory element.

3. The ADC calibration circuit of claim 2, wherein each of said M×N selector elements comprises a transistor.

4. The ADC calibration circuit of claim 2, further comprising a calibration control circuit, wherein said memory element is responsive to said calibration control circuit.

5. The ADC calibration circuit of claim 1, wherein the plurality of reference voltage sources comprise a plurality of resistances configured serially and a voltage source in communication with one of said plurality of resistances.

6. The ADC calibration circuit of claim 1, wherein X=M.

7. The ADC calibration circuit of claim 1, wherein each of said plurality of second wirings is connected to every Z adjacent ones of the N columns of said M×N selector elements, wherein Z=1.

8. The ADC calibration circuit of claim 1, wherein each of said plurality of second wirings is connected to every Z adjacent ones of the N columns of said M×N selector elements, wherein Z=2.

9. The ADC calibration circuit of claim 1, wherein each of said plurality of second wirings is connected to every Z adjacent ones of the N columns of said M×N selector elements, wherein Z=4.

10. A method of wiring an ADC calibration circuit, comprising:

a) forming an array of M×N selector elements arranged in M rows and N columns, wherein each of the selector elements has a first and second terminal;

b) forming a plurality of comparators, c) connecting together the first terminals with a plurality of first level wirings, wherein each of the plurality of first level wirings are connected to the first terminals of N of the M×N selector elements for each corresponding one of M rows, wherein each of the plurality of first wirings is in connection with a corresponding one input of each of the plurality of comparators;

d) connecting together the second terminals with a plurality of second level wirings, wherein each of the plurality of second level wirings to the second terminals of X of the M×N selector elements and to only one of the M×N selector elements on each one of the M rows, wherein X is at most M, wherein each of the plurality of second level wirings is in connection with a corresponding one of a plurality of voltage sources.

11. The method of claim 10, wherein connecting together the second terminals with the plurality of second level wirings is done by connecting every Z adjacent ones of the N columns of the M×N selector elements, wherein Z=1.

12. The method of claim 10, wherein connecting together the second terminals with the plurality of second level wirings is done by connecting every Z adjacent ones of the N columns of the M×N selector elements, wherein Z=2.

13. The method of claim 10, wherein connecting together the second terminals with the plurality of second level wirings is done by connecting every Z adjacent ones of the N columns of the M×N selector elements, wherein Z=4.

14. The method of claim 10, wherein a) and b) are formed on a single integrated circuit.

15. An ADC calibration circuit comprising:

a) a plurality of comparator means for comparing a corresponding one of a plurality of reference voltages with an input signal;

b) M×N selector means arranged in M rows and N columns, each of said M×N selector means having first and second terminals;

c) a plurality of first wiring means, each of said plurality of first wiring means for connecting said first terminals of N of said M×N selector means for each corresponding one of the M rows with a corresponding second input of each of said plurality of comparator means;

d) a plurality of second wiring means, each of said plurality of second wiring means for connecting said second terminals of X of said M×N selector means and to only one of said M×N selector means on each one of the M rows, wherein X is at most M, wherein each of said plurality of second wiring means is in communication with a corresponding one of a plurality of reference voltages, said M×N selecting means for selecting ones of said plurality first wiring and ones of said plurality of second wirings.

16. The ADC calibration circuit of claim 15, wherein each of said M×N selector means comprises memory means for storing an operating state of said M×N selector means.

17. The ADC calibration circuit of claim 16, wherein each of said M×N selector means comprises a transistor.

18. The ADC calibration circuit of claim 16, further comprising calibration control means for storing the operating state in said memory means.

19. The ADC calibration circuit of claim 15, wherein the plurality of reference voltages sources comprise a plurality of resistances configured serially and a voltage source in communication with one of said plurality of resistances.

20. The ADC calibration circuit of claim 15, wherein X=M.

21. The ADC calibration circuit of claim 15, wherein each of said plurality of second wiring means is connected to every Z adjacent ones of the N columns of said M×N selector means, wherein Z=1.

22. The ADC calibration circuit of claim 15, wherein each of said plurality of second wiring means is connected to every Z adjacent ones of the N columns of said M×N selector means, wherein Z=2.

23. The ADC calibration circuit of claim 15, wherein each of said plurality of second wiring means is connected to every Z adjacent ones of the N columns of said M×N selector means, wherein Z=4.

24. An ADC calibration circuit comprising:

a) a plurality of comparators;

b) a plurality of elements, each of said plurality of selectors elements having first and second terminals and each comprising a memory element;

c) a plurality of first wirings, each of said plurality of first wirings being in communication with said first terminals of said plurality of selector elements and a corresponding input of each of said plurality of comparators;

d) a plurality of second wirings, each of said plurality of second wirings being in communication with said second terminals of said plurality of selector elements and a corresponding one of a plurality of reference voltages.

25. The ADC calibration circuit of claim 24, wherein each of said plurality of selector elements comprises a transistor.

26. The ADC calibration circuit of claim 24, further comprising calibration control circuit, wherein said memory element is responsive to said calibration control circuit.

27. The ADC calibration circuit of claim 24, wherein the plurality of reference voltage sources comprise a plurality of resistances configured serially and a voltage source in communication with one of said plurality of resistances.

28. An ADC calibration circuit comprising:
   a) a plurality of comparator means for comparing a corresponding one of a plurality of reference voltages with an input signal;
   b) a plurality of selector means, each of said plurality of selector means having first and second terminals, and each comprising memory means for storing an operating state of a corresponding one of said plurality of selector means;
   c) a plurality of first wiring means, each of said plurality of first wiring means for connecting said first terminals of said plurality of selector means with a corresponding input of each of said plurality of comparator means;
   d) a plurality of second wiring means, each of said plurality of second wiring means for connecting said second terminals of said plurality of selector means with a corresponding one of a plurality of reference voltages,
   said selecting means for selecting ones of said plurality first wiring and ones of said plurality of second wirings.

29. The ADC calibration circuit of claim 28, wherein each of said plurality of selector means comprises a transistor.

30. The ADC calibration circuit of claim 28, further comprising calibration control means for storing the operating state in said memory means.

31. The ADC calibration circuit of claim 28, wherein the plurality of reference voltage sources a plurality of resistances configured serially and a voltage source in communication with one of said plurality of resistances.

* * * * *